US006971078B2

(12) United States Patent
Ohba et al.

(10) Patent No.: US 6,971,078 B2
(45) Date of Patent: Nov. 29, 2005

(54) SEMICONDUCTOR-DEVICE DESIGN METHOD, SEMICONDUCTOR-DEVICE DESIGN PROGRAM AND SEMICONDUCTOR-DEVICE DESIGN APPARATUS

(75) Inventors: Hisayoshi Ohba, Kawasaki (JP); Jun Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 132 days.

(21) Appl. No.: 10/459,435

(22) Filed: Jun. 12, 2003

(65) Prior Publication Data

US 2004/0003359 A1    Jan. 1, 2004

(30) Foreign Application Priority Data

Jun. 28, 2002    (JP) .............................. 2002-190821

(51) Int. Cl.[7] .......................... G06F 17/50; G06F 9/45
(52) U.S. Cl. ................. 716/5; 716/10; 716/13
(58) Field of Search ................. 716/5, 10–13, 716/21

(56) References Cited

U.S. PATENT DOCUMENTS

| 6,178,543 | B1 * | 1/2001 | Chen et al. ................. 716/19 |
| 6,243,653 | B1 * | 6/2001 | Findley ........................ 702/65 |
| 6,678,879 | B1 * | 1/2004 | Hawse et al. .................. 716/21 |
| 2002/0162082 | A1 * | 10/2002 | Cwynar et al. ............... 716/12 |
| 2003/0177464 | A1 * | 9/2003 | Takechi et al. ............... 716/10 |
| 2003/0229875 | A1 * | 12/2003 | Smith et al. ................... 716/10 |

\* cited by examiner

*Primary Examiner*—Stacy A. Whitmore
*Assistant Examiner*—Magid Y. Dimyan
(74) *Attorney, Agent, or Firm*—Staas & Halsey LLP

(57) ABSTRACT

A semiconductor-device design method considering change in capacitance between wiring patterns due to an inserted dummy pattern. An information reception part receives dummy rule information about rules for dummy patterns and process information about wiring structure of wiring patterns. A capacitance calculation part calculates a capacitance value for each of wiring distances between the wiring patterns defined by the process information, under the condition that a dummy pattern defined by the dummy rule information is inserted between the wiring patterns. A wiring-pattern capacitance calculation part calculates capacitance values between wiring patterns of an intended semiconductor device defined by layout data stored in a layout database, referring to the capacitance values calculated by the capacitance calculation part. Thus, a semiconductor device considering change in capacitance between wiring patterns due to an inserted dummy pattern is designed.

13 Claims, 10 Drawing Sheets

SEMICONDUCTOR-DEVICE DESIGN METHOD, SEMICONDUCTOR-DEVICE DESIGN PROGRAM AND SEMICONDUCTOR-DEVICE DESIGN APPARATUS

CROSS-REFERENCE TO RELATED APPLICATIONS

This application is based upon and claims priority of Japanese Patent Application No. 2002-190821, filed on Jun. 28, 2002, the contents being incorporated herein by reference.

BACKGROUND OF THE INVENTION (1) Field of the Invention

The invention relates to a semiconductor-device design method, a semiconductor-device design program, and a semiconductor-device design apparatus, particularly those wherein change in capacitance due to a dummy pattern is taken into consideration.

(2) Description of the Related Art

At present, in the field of semiconductor devices, inserting a dummy pattern between wiring patterns is an essential technique for reducing difference in flatness of a chip surface and difference in thickness of wiring patterns, which differences are due to uneven wiring pattern density. Hence, there is a design tool for designing a semiconductor device with dummy patterns inserted.

For example, in aluminum wiring, when etching for forming wiring is carried out, side-wall protective films are formed on side-walls of wiring patterns. Uneven wiring pattern density would cause an undesired variance in the side-wall protective film thickness. The existing design tools avoid this problem by placing dummy patterns in sparse portions to populate the patterns as uniformly as possible.

In copper wiring, uneven wiring pattern density would cause dishing, that is, a phenomenon that the center of a wiring pattern is dented, in CMP (Chemical Mechanical Polishing). The existing design tools avoid this problem by placing dummy patterns in sparse portions to populate the patterns as uniformly as possible.

However, when a dummy pattern having no potential difference (being in a floating state) is inserted between wiring patterns, the physical distance between the wiring patterns becomes smaller by the width of the dummy pattern. Hence, the capacitance value between the wiring patterns changes.

FIG. 10 shows a flow of a process performed by a conventional design tool. The design tool is installed in a computer to perform the following process:

[Step S21] Process information about wiring structure such as wiring width, wiring distance, wiring height and dielectric constant of a wiring pattern in each wiring layer is received.

[Step S22] A capacitance value for each of wiring distances between the wiring patterns defined by the process information is calculated, and an RC rule file containing the calculated capacitance values is created. The RC rule file is stored in an RC rule database.

[Step S23] Referring to the RC rule file, capacitance values produced between wiring patterns of an intended semiconductor device defined by layout data stored in a layout database are calculated.

[Step S24] Using the calculated capacitance values, analysis of operation of a signal in the wiring patterns defined by the layout data is performed.

[Step S25] Whether the signal performs intended operation or not is determined. If the signal does not perform the intended operation, step S26 is taken. If it does, step S28 is taken.

[Step S26] The layout data is corrected in respect of the wiring patterns so that the signal will perform the intended operation. The layout data corrected in respect of the wiring patterns is stored in the layout database.

[Step S27] Whether the corrected layout data meets design rules such as a rule about processing dimension or not is checked.

[Step S28] Dummy patterns defined by data stored in a dummy rule database are inserted between the wiring patterns defined by the layout data.

[Step S29] Mask data is generated from the layout data, which covers dummy patterns inserted between wiring patterns.

In the case of the conventional design tool, the RC rule file does not reflect change in capacitance due to the inserted dummy patterns. The operation analysis is carried out using the capacitance values calculated referring to this RC rule file, and mask data about the wiring patterns with the dummy patterns inserted between is created. Thus, with the conventional design tool, there is a problem that a semiconductor device is designed without considering change in capacitance between wiring patterns due to an inserted dummy pattern.

SUMMARY OF THE INVENTION

The invention has been made considering the above. An object of the invention is to provide a semiconductor-device design method, a semiconductor-device design program, and a semiconductor-device design apparatus wherein a semiconductor device is designed considering change in capacitance between wiring patterns due to an inserted dummy pattern.

In order to achieve the above object, the invention provides a semiconductor-device design method using a computer, considering change in capacitance due to a dummy pattern. This method comprises the steps of receiving dummy rule information about rules for dummy patterns and process information about wiring structure of wiring patterns; calculating a capacitance value for each of wiring distances between the wiring patterns defined by the process information, under the condition that a dummy pattern defined by the dummy rule information is inserted between the wiring patterns; and calculating capacitance values between wiring patterns of an intended semiconductor device defined by data stored in a storage device, referring to the calculated capacitance value for each of the wiring distances.

In order to achieve the above object, the invention further provides a semiconductor-device design program considering change in capacitance due to a dummy pattern. This program makes a computer receive dummy rule information about rules for dummy patterns and process information about wiring structure of wiring patterns; calculate a capacitance value for each of wiring distances between the wiring patterns defined by the process information, under the condition that a dummy pattern defined by the dummy rule information is inserted between the wiring patterns; and calculate capacitance values between wiring patterns of an intended semiconductor device defined by data stored in a storage device, referring to the calculated capacitance value for each of the wiring distances.

In order to achieve the above object, the invention further provides a semiconductor-device design apparatus considering change in capacitance due to a dummy pattern. This apparatus comprises an information reception part for receiving dummy rule information about rules for dummy patterns and process information about wiring structure of wiring patterns; a capacitance calculation part for calculating a capacitance value for each of wiring distances between the wiring patterns defined by the process information, under the condition that a dummy pattern defined by the dummy rule information is inserted between the wiring patterns; and a wiring-pattern capacitance calculation part for calculating capacitance values between wiring patterns of an intended semiconductor device defined by data stored in a storage device, referring to the calculated capacitance value for each of the wiring distances.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
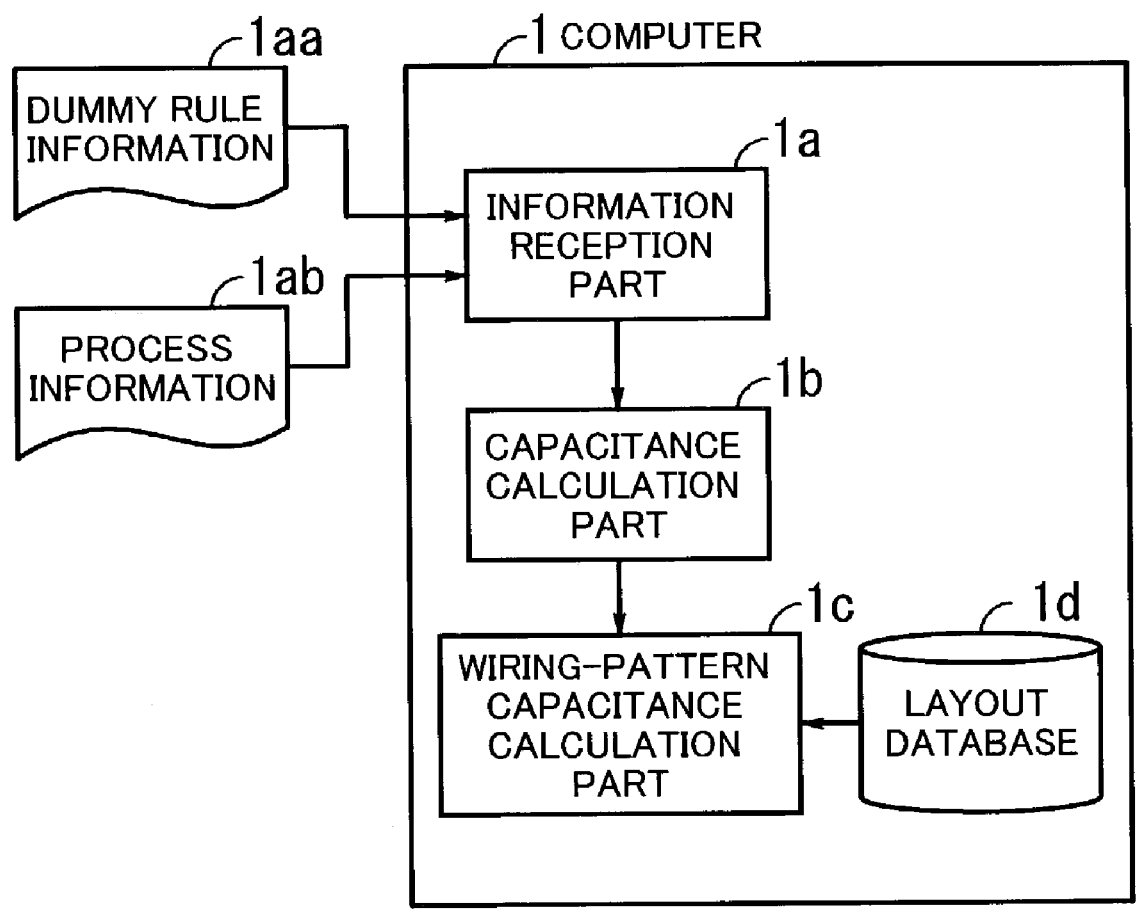
FIG. 1 is a diagram for explaining the principle of the invention.

First, the invention will be outlined, referring to the drawings.

FIG. 1 is a diagram for explaining the principle of the invention. FIG. 1 shows a computer 1 which executes a semiconductor-device design method according to the invention. The computer 1 has an information reception part 1a, a capacitance calculation part 1b, a wiring-pattern capacitance calculation part 1c, and a layout database 1d.

Dummy rule information 1aa shown in FIG. 1 is information about rules for dummy patterns, and received by the information reception part 1a. Process information 1ab is information about wiring structure of wiring patterns, and received by the information reception part 1a. The layout database 1d is a database which stores layout data about an intended semiconductor device. The layout data includes data about arrangement of wiring patterns, cells, macros and the like and connection information. The layout database 1d is constructed in a storage device such as a hard disc drive and a RAM (Random Access Memory).

It is to be noted that the process information 1ab includes at least such information about wiring structure of wiring patterns as is stored in the layout database 1d.

From the dummy rule information 1aa and the process information 1ab, the computer 1 calculates capacitance values between wiring patterns with a dummy pattern inserted. The capacitance values thus calculated are used as models. Referring to those calculated capacitance values, the computer 1 calculates capacitance values between wiring patterns of an intended semiconductor device defined by layout data stored in the layout database 1d.

The information reception part 1a receives dummy rule information 1aa and process information 1ab.

The capacitance calculation part 1b calculates a capacitance value for each of wiring distances between the wiring patterns whose wiring structure is given as the process information 1ab, under the condition that a dummy pattern which is based on the rules given as the dummy rule information 1aa is inserted between the wiring patterns.

The wiring-pattern capacitance calculation part 1c calculates capacitance values between wiring patterns of an intended semiconductor device defined by layout data stored in the layout database 1d, referring to the capacitance values calculated by the capacitance calculation part 1b.

Next, the operation will be described on the basis of FIG. 1.

First, the information reception part 1a of the computer 1 receives dummy rule information 1aa and process information 1ab.

From the dummy rule information 1aa and process information 1ab, the capacitance calculation part 1b calculates a capacitance value for each of wiring distances between wiring patterns, under the condition that a dummy pattern is inserted between the wiring patterns.

Referring to the capacitance values calculated by the capacitance calculation part 1b, the wiring-pattern capacitance calculation part 1c calculates capacitance values between the wiring patterns defined by layout data stored in the layout database 1d.

As described above, in the present invention, dummy rule information and process information are received, and a capacitance value for each of wiring distances between wiring patterns is calculated under the condition that a dummy pattern is inserted between the wiring patterns. Then, referring to those calculated capacitance values, capacitance values between wiring patterns of an intended semiconductor device are calculated. Thus, a semiconductor device wherein change in capacitance value between wiring patterns due to an inserted dummy pattern is taken into consideration can be designed.

Prior to describing embodiments of the invention, relation between the distance between wiring patterns and the capacitance produced between the wiring patterns, and relation between the distance between wiring patterns and the capacitance produced between the wiring patterns with a dummy pattern inserted will be explained.

Figure 2:
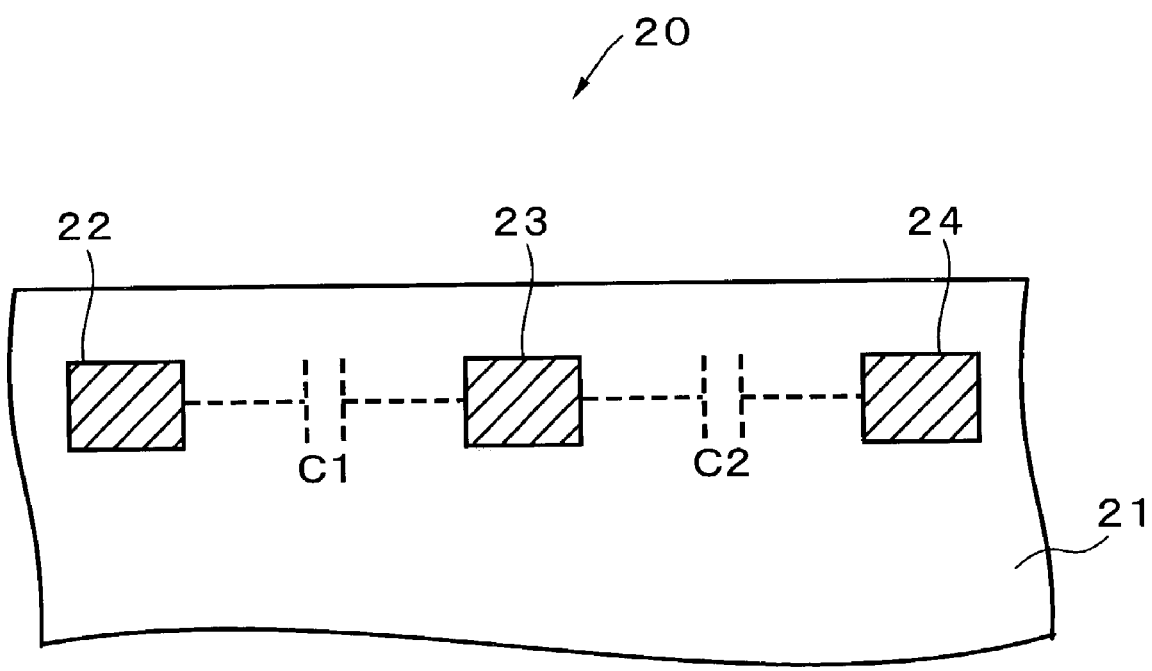
FIG. 2 is a first cross-sectional view of a semiconductor device.

FIG. 2 is a first cross-sectional view of a semiconductor device. As shown in FIG. 2, a semiconductor device 20 comprises an insulator 21 and wiring patterns 22 to 24 formed in the insulator 21. The wiring patterns 22 to 24 are arranged next to each other in the semiconductor-device lateral direction (horizontal direction in FIG. 2).

Generally, wiring patterns arranged next to each other produce a capacitance. A capacitor symbol C1 shown as dotted lines represents a capacitance produced between the wiring pattern 22 and the wiring pattern 23. A capacitor symbol C2 represents a capacitance produced between the wiring pattern 23 and the wiring pattern 24.

Figure 3:
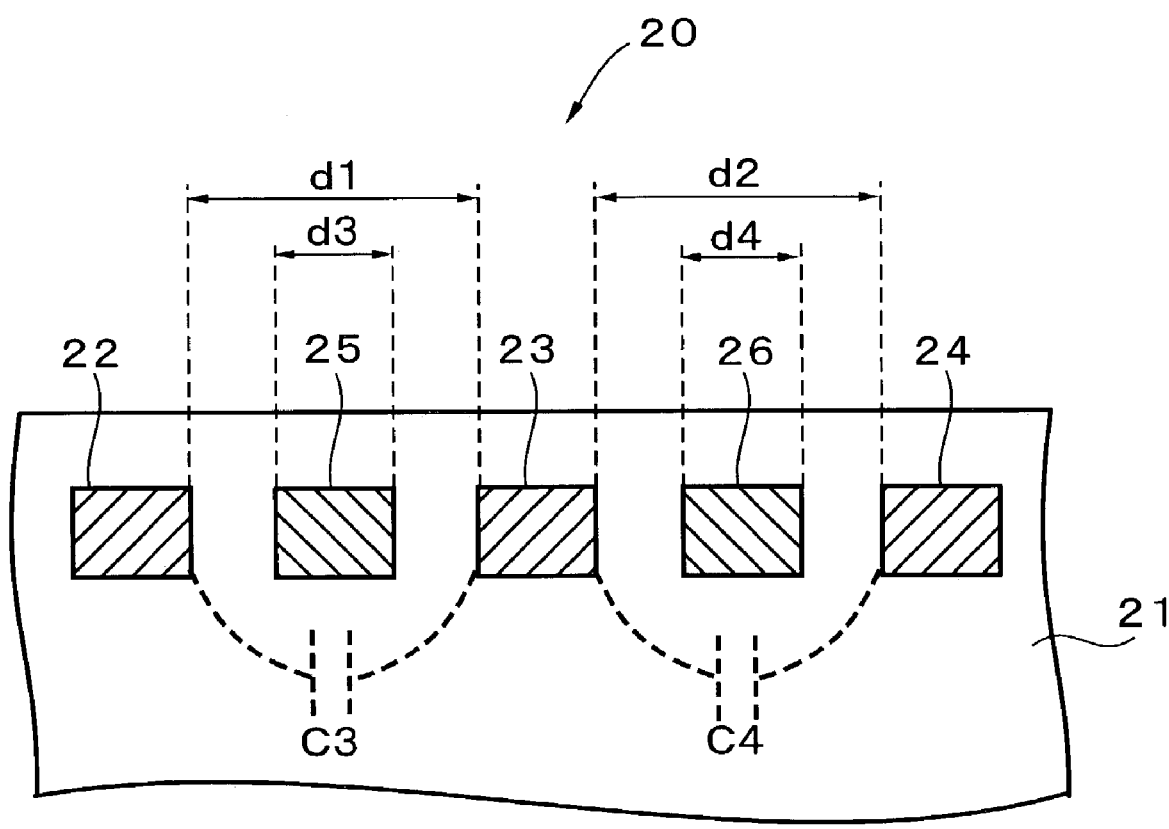
FIG. 3 is a cross-sectional view of the semiconductor device in FIG. 2 with dummy patterns inserted.

FIG. 3 is a cross-sectional view of the semiconductor device shown in FIG. 2 with dummy patterns inserted. As shown in FIG. 3, in the semiconductor device 20, a dummy pattern 25 is inserted between the wiring pattern 22 and the wiring pattern 23, and a dummy pattern 26 is inserted between the wiring pattern 23 and the wiring pattern 24.

A capacitor symbol C3 represents a capacitance produced between the wiring pattern 22 and the wiring pattern 23 when the dummy pattern 25 is inserted. A capacitor symbol C4 represents a capacitance produced between the wiring pattern 23 and the wiring pattern 24 when the dummy pattern 26 is inserted.

Let us suppose that the distance between the wiring pattern 22 and the wiring pattern 23 and the distance between the wiring pattern 23 and the wiring pattern 24 are d1 and d2, respectively, and that the pattern width of the dummy pattern 25 and the pattern width of the dummy pattern 26 are d3 and d4, respectively.

Generally, the capacitance between wiring patterns is represented by $C = \epsilon \times S/d$ ($\epsilon$: dielectric constant, S: area of a wiring pattern, d: distance between wiring patterns). In the following explanation, in order to make the explanation simple, it is supposed that the surfaces of the wiring patterns which face each other are all S in area.

The capacitance of the capacitor symbol C1 shown in FIG. 2 is $\epsilon \times S/d1$. When the dummy pattern 25 is inserted as shown in FIG. 3, since the dummy pattern 25 does not produce potential difference, the distance between the wiring pattern 22 and the wiring pattern 23 practically decreases to d1–d3. Hence, the capacitance of the capacitor symbol C3 increases to $\epsilon \times S/(d1-d3)$.

The capacitance of the capacitor symbol C2 shown in FIG. 2 is $\epsilon \times S/d2$. When the dummy pattern 26 is inserted as shown in FIG. 3, the distance between the wiring pattern 23 and the wiring pattern 24 practically decreases to d2–d4, for the like reason. Hence, the capacitance of the capacitor symbol C4 increases to $\epsilon \times S/(d2-d4)$.

Figure 4:
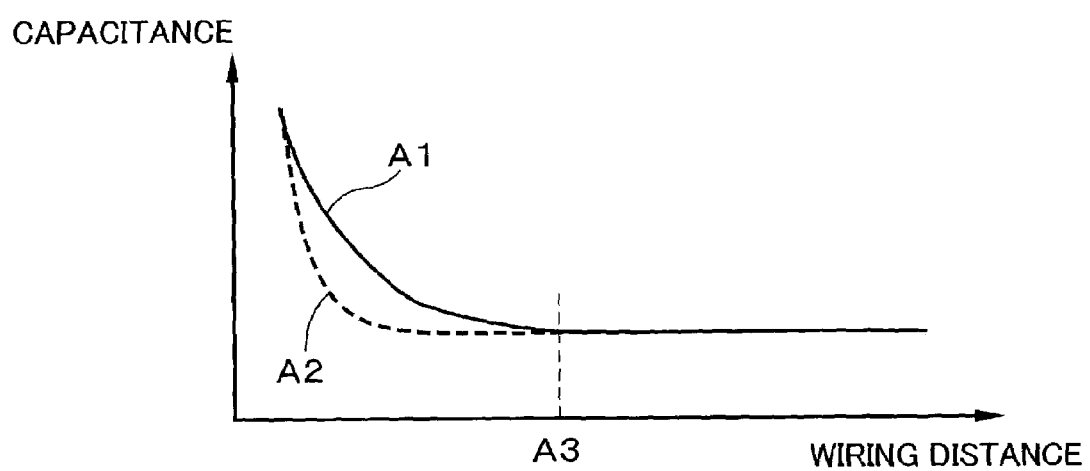
FIG. 4 is a graph showing relation between the distance between wiring patterns arranged in the lateral direction (wiring width direction) and the capacitance between them.

FIG. 4 is a graph showing relation between the distance between wiring patterns arranged in the lateral direction (wiring width direction) and the capacitance between them, where the abscissa represents the wiring distance and the ordinate represents the capacitance. Solid line A1 shows relation between the wiring distance between wiring patterns and the capacitance between them in the case where a dummy pattern is inserted. Dotted line A2 shows relation between the wiring distance between wiring patterns and the capacitance between them in the case where no dummy pattern is inserted.

As explained with reference to FIGS. 2 and 3, the capacitance produced between wiring patterns increases due to an inserted dummy pattern. However, when the wiring distance is larger than threshold A3, the capacitance between wiring patterns with a dummy pattern inserted does not differ from the capacitance between them with no dummy pattern inserted.

In other words, the capacitance between wiring patterns increases due to an inserted dummy pattern. However, when the wiring distance is larger than a certain threshold, the capacitance between wiring patterns with a dummy pattern inserted does not differ from the capacitance between them with no dummy pattern inserted.

Figure 5:
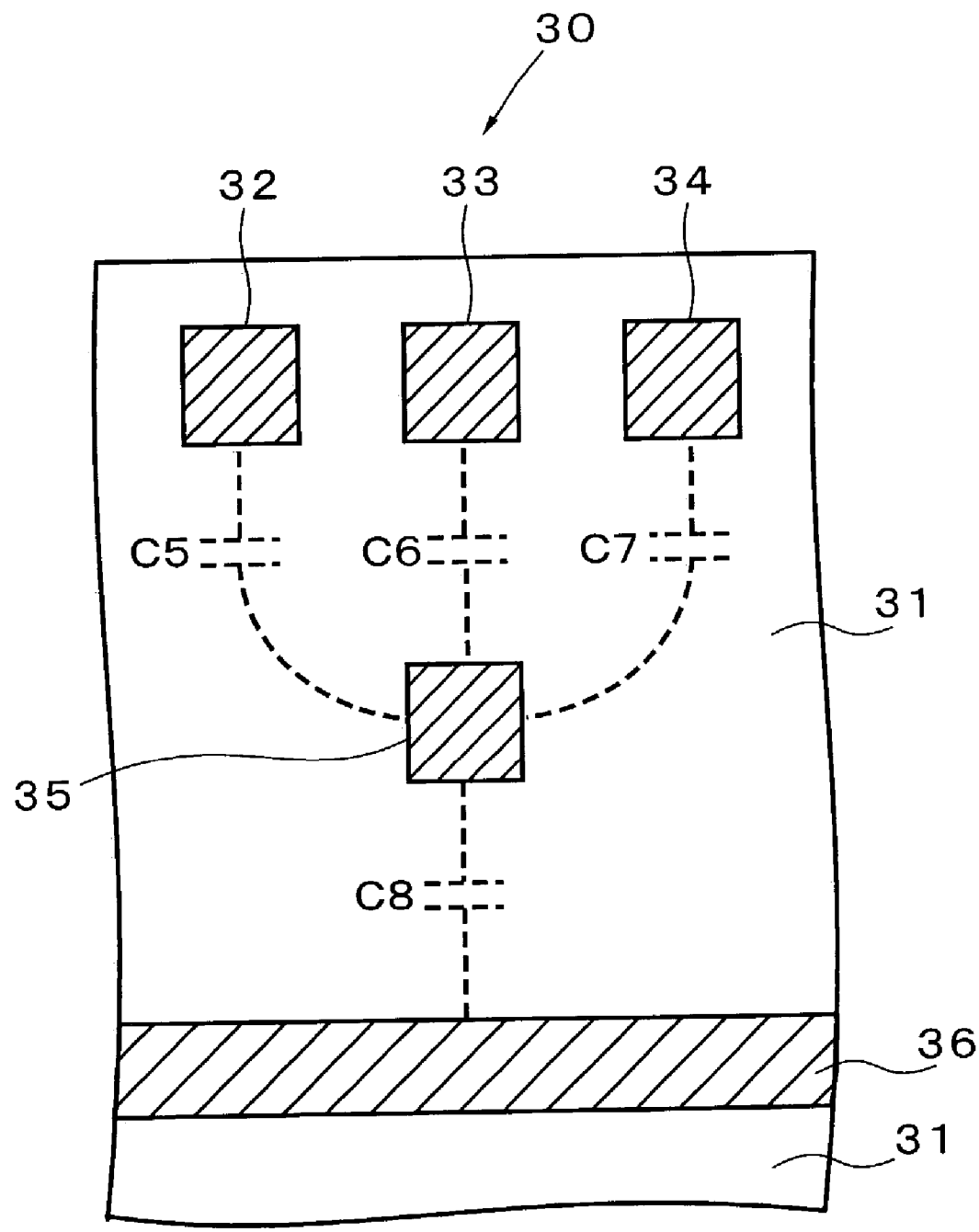
FIG. 5 is a second cross-sectional view of a semiconductor device.

FIG. 5 shows a second cross-sectional view of a semiconductor device. As shown in FIG. 5, a semiconductor device 30 comprises an insulator 31 and wiring patterns 32 to 36 formed in the insulator 31. The wiring patterns 32 to 34 are arranged in the lateral direction, while the wiring patterns 35, 36 are arranged in the vertical direction (perpendicular direction in FIG. 5).

Like the case in FIG. 2, wiring patterns arranged next to each other in the vertical direction (wiring height direction) also produce a capacitance. A capacitor symbol C5 shown as dotted lines represents a capacitance produced between the wiring pattern 32 and the wiring pattern 35. A capacitor symbol C6 represents a capacitance produced between the wiring pattern 33 and the wiring pattern 35. A capacitor symbol C7 represents a capacitance produced between the wiring pattern 34 and the wiring pattern 35. A capacitor symbol C8 represents a capacitance produced between the wiring pattern 35 and the wiring pattern 36.

Figure 6:
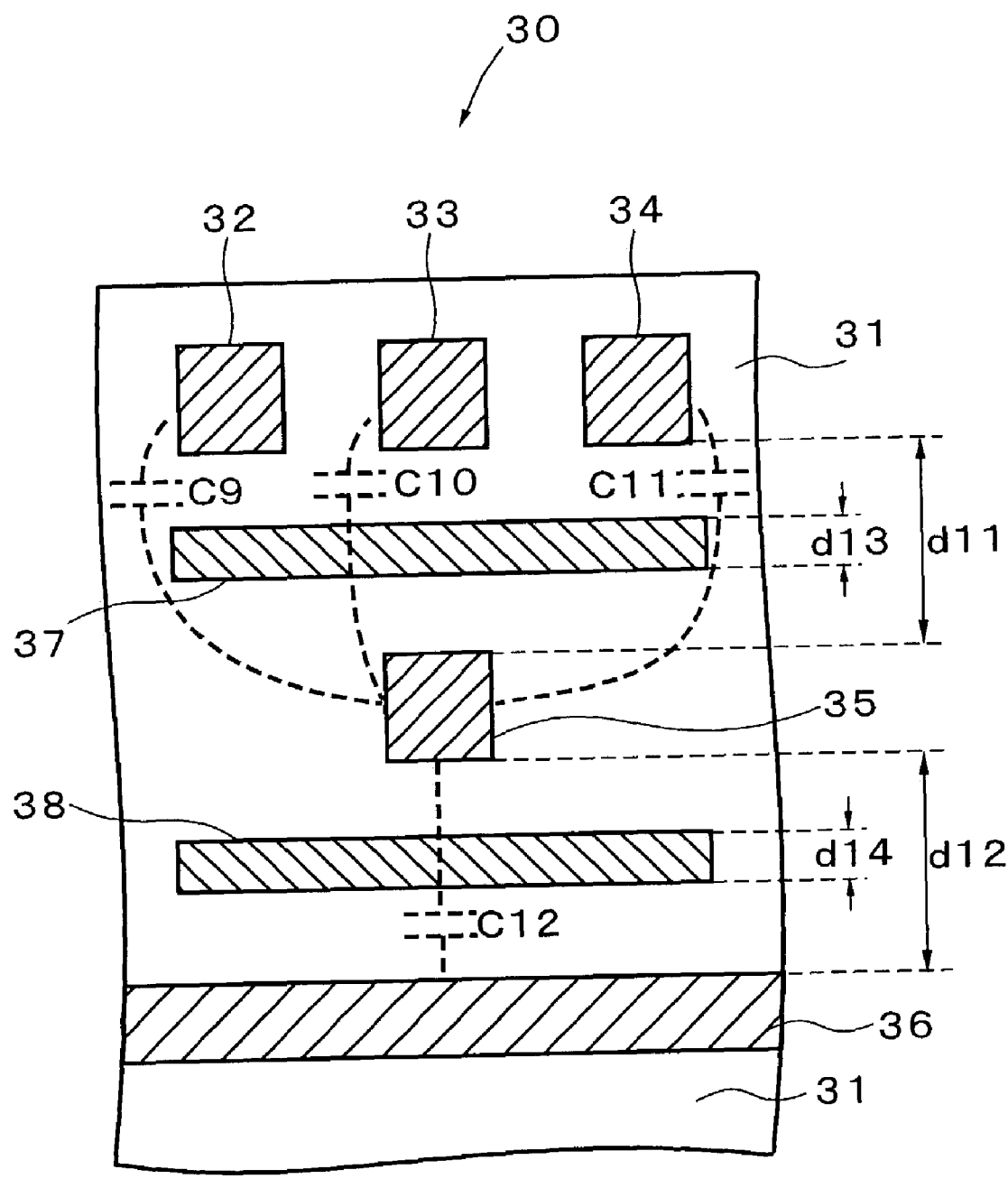
FIG. 6 is a cross-sectional view of the semiconductor device in FIG. 5 with dummy patterns inserted.

FIG. 6 is a cross-sectional view of the semiconductor device shown in FIG. 5 with dummy patterns inserted. As shown in FIG. 6, in the semiconductor device 30, a dummy pattern 37 is inserted between the wiring patterns 32 to 34 and the wiring pattern 35, and a dummy pattern 38 is inserted between the wiring pattern 35 and the wiring pattern 36.

A capacitor symbol C9 represents a capacitance produced between the wiring pattern 32 and the wiring pattern 35 when the dummy pattern 37 is inserted. A capacitor symbol C10 represents a capacitance produced between the wiring pattern 33 and the wiring pattern 35 when the dummy pattern 37 is inserted. A capacitor symbol C11 represents a capacitance produced between the wiring pattern 34 and the wiring pattern 35 when the dummy pattern 37 is inserted. A capacitor symbol C12 represents a capacitance produced between the wiring pattern 35 and the wiring pattern 36 when the dummy pattern 38 is inserted.

Let us suppose that the distance between the wiring patterns 32 to 34 and the wiring pattern 35 and the distance between the wiring pattern 35 and the wiring pattern 36 are d11 and d12, respectively, and that the wiring height of the dummy pattern 37 and the wiring height of the dummy pattern 38 are d13 and d14, respectively.

The capacitance of each of the capacitor symbols C5 to C7 shown in FIG. 5 is $\epsilon \times S/d11$. When the dummy pattern 37 is inserted as shown in FIG. 6, the distance between the wiring patterns 32 to 34 and the wiring pattern 35 practically decreases to d11–d13. Hence, the capacitance of each of the capacitor symbols C9 to C11 increases to $\epsilon \times S/(d11-d13)$.

The capacitance of the capacitor symbol C8 shown in FIG. 5 is $\epsilon \times S/d12$. When the dummy pattern 38 is inserted as shown in FIG. 6, the distance between the wiring patterns practically decreases to d12–d14. Hence, the capacitance of the capacitor symbol C12 increases to $\epsilon \times S/(d12-d14)$.

Figure 7:
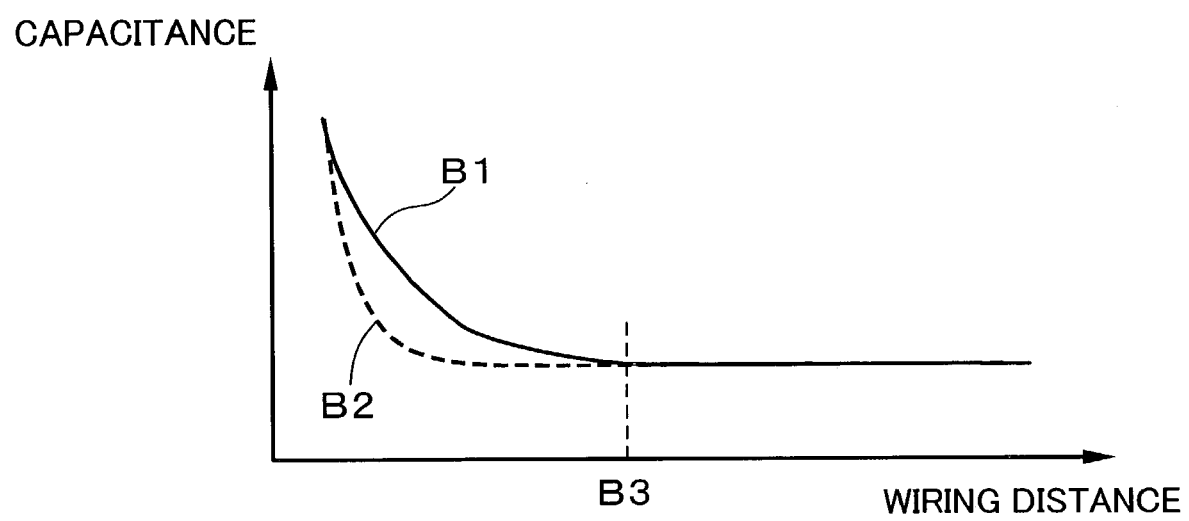
FIG. 7 is a graph showing relation between the distance between wiring patterns arranged in the vertical direction (wiring height direction) and the capacitance between them.

FIG. 7 is a graph showing relation between the distance between wiring patterns arranged in the vertical direction (wiring height direction) and the capacitance between them, where the abscissa represents the wiring distance and the ordinate represents the capacitance. Solid line B1 shows relation between the wiring distance between wiring patterns and the capacitance between them in the case where a dummy pattern is inserted. Dotted line B2 shows relation between the wiring distance between wiring patterns and the capacitance between them in the case where no dummy pattern is inserted.

As explained with reference to FIGS. 5 and 6, the capacitance produced between wiring patterns increases due to an inserted dummy pattern. However, when the wiring distance is larger than threshold B3, the capacitance between wiring patterns with a dummy pattern inserted does not differ from the capacitance between them with no dummy pattern inserted.

In other words, the capacitance between wiring patterns arranged in the vertical direction increases due to an inserted dummy pattern. However, when the wiring distance is larger than a certain threshold, the capacitance between wiring patterns with a dummy pattern inserted does not differ from the capacitance between them with no dummy pattern inserted.

To sum up, the capacitance produced between wiring patterns increases due to an inserted dummy pattern, however, when the wiring distance is larger than a certain value (threshold A3, B3), the capacitance between wiring patterns with a dummy pattern inserted does not differ from the capacitance between them with no dummy pattern inserted.

Next, an embodiment of the invention will be described taking an example where it is applied to CAD (a computer with a CAD (Computer Aided Design) system installed).

Figure 8:
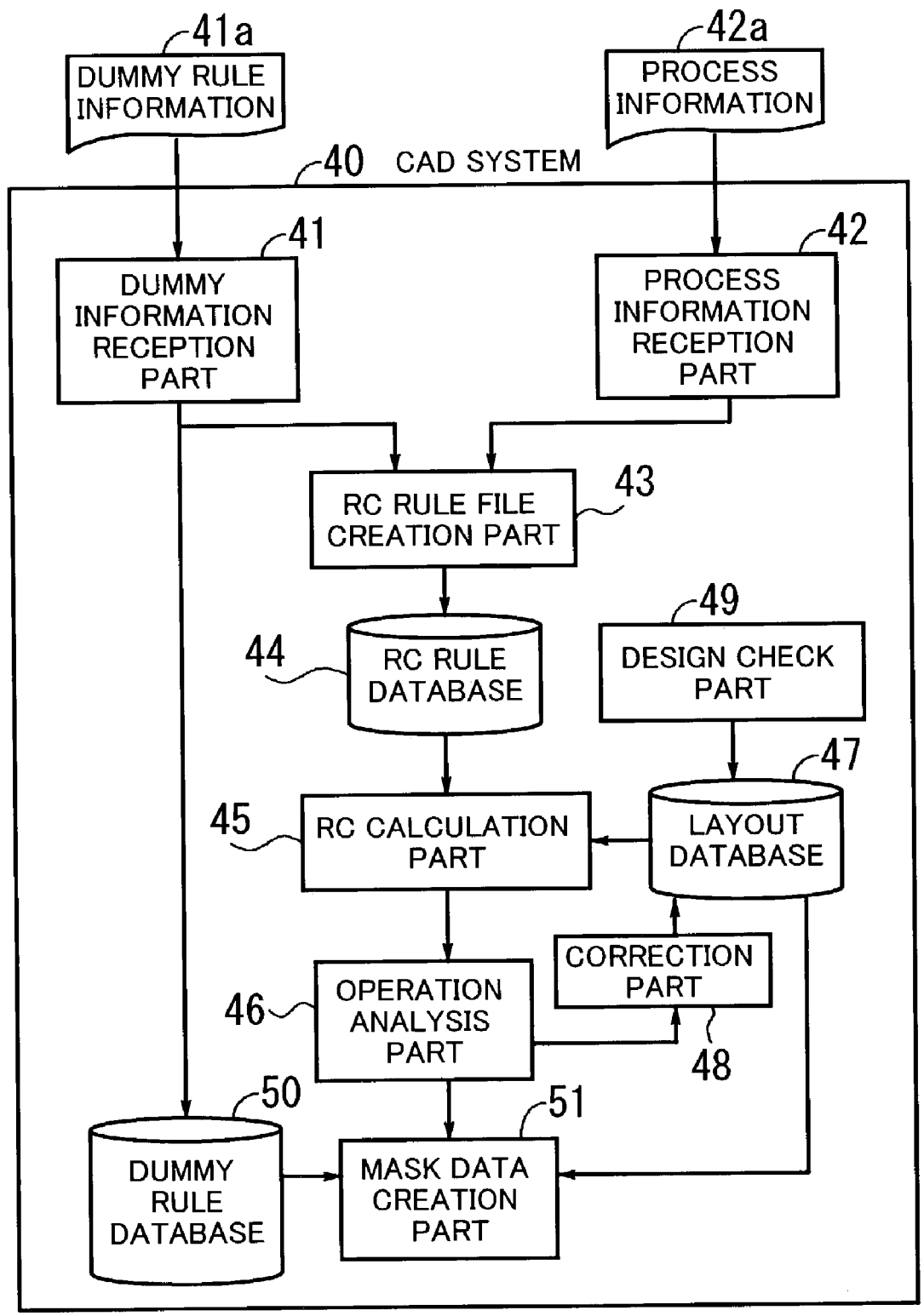
FIG. 8 is a functional block diagram of a CAD system.

FIG. 8 is a functional block diagram of a CAD system. As shown in FIG. 8, the CAD system 40 includes a dummy information reception part 41, a process information reception part 42, an RC rule file creation part 43, an RC rule database 44, an RC calculation part 45, an operation analysis part 46, a layout database 47, a correction part 48, a design check part 49, a dummy rule database 50, and a mask data creation part 51.

The RC rule database 44 is a database in which RC rule files are stored. The layout database 47 is a database in which layout data such as data about wiring patterns, cells and macros of the intended semiconductor devices is stored. The dummy rule database 50 is a database in which data about dummy patterns to be inserted between wiring patterns is stored. The layout database 47 and the dummy rule database 50 are constructed of a storage device such as a hard disc drive and an RAM.

The dummy information reception part 41 receives dummy rule information 41a. The dummy rule information 41a is information about wiring structure such as wiring width and wiring height of a dummy pattern in each wiring layer, distance between dummy patterns, and distance between a wiring pattern and a dummy pattern. The dummy information reception part 41 stores the received dummy rule information 41a in the dummy rule database 50, as dummy rule data about dummy patterns to be inserted between wiring patterns. The dummy information reception part 41 is actually a keyboard 40 of the CAD system 40.

The process information reception part 42 receives process information 42a. The process information 42a is information about wiring structure such as wiring width, wiring distance, wiring height, and dielectric constant of a wiring pattern in each wiring layer. It is to be noted that the process information 42a includes at least such information about wiring structure of wiring patterns as is stored in the layout database 47. The process information reception part 42 is actually the keyboard of the CAD system 40.

The RC rule file creation part 43 calculates a capacitance value for each of wiring distances between the wiring patterns defined by the process information 42a received by the process information reception part 42, under the condition that a dummy pattern defined by the dummy rule information 41a received by the dummy rule information reception part 41 is inserted between the wiring patterns.

Specifically, the RC rule file creation part 43 calculates a capacitance value for each of the wiring distances between the wiring patterns, referring to wiring widths, wiring heights and dielectric constants included in the process information 42a. Then, the RC rule file creation part 43 calculates a capacitance value for each of the wiring distances between the wiring patterns with a dummy pattern inserted, by subtracting the wiring width of the dummy pattern, which is included in the dummy rule information 41a, from each of the wiring distances. If the wiring distance is plotted along the abscissa and the capacitance is plotted along the ordinate, it forms a line like solid lines A1, B1 in FIGS. 4 and 7.

The RC rule file creation part 43 creates an RC rule file which contains the calculated capacitance value for each of the wiring distances. The RC rule file contains both or either of the capacitance value for each of wiring distances measured in the wiring width direction and the capacitance value for each of wiring distances measured in the wiring height direction. The RC rule file creation part 43 stores the created RC rule file in the RC rule database 44. The capacitance values calculated by the RC rule file creation part 43 are used as models when capacitance values between wiring patterns defined by data (layout data) stored in the layout database 47 are calculated as described below.

The RC calculation part 45 calculates capacitance values between wiring patterns defined by layout data stored in the layout database 47, referring to the RC rule file stored in the RC rule database 44. This means that the capacitance values between the wiring patterns defined by layout data stored in the layout database 47 are calculated supposing that dummy patterns defined by the dummy rule information 41a are inserted between the wiring patterns.

The operation analysis part 46 performs analysis of operation of a signal in the wiring patterns defined by layout data stored in the layout database 47, using the capacitance values calculated by the RC calculation part 45. Specifically, the operation analysis is performed about signal propagation time, i.e., the time which a signal takes to propagate in the wiring patterns, crosstalk, and the like. The operation analysis part 46 determines whether the signal performs intended operation or not.

When the operation analysis part 46 determines that the signal does not perform the intended operation, the correction part 48 corrects data about the wiring patterns stored in the layout database 47 so that the signal will perform the intended operation. For example, a distance between wiring patterns is widened to reduce the influence of a capacitance value. Specifically, the distance is made larger than threshold A3 in FIG. 4 or threshold B3 in FIG. 7. If the signal propagation time is less than an intended design value, the capacitance value between wiring patterns is adjusted by adjusting the wiring distance between them, on the basis of the relation between the wiring distance and the capacitance value shown in FIG. 4 or 7, so that the propagation time will agree with the design value. The correction part 48 stores the corrected layout data in the layout database 47.

The design check part 49 checks that the corrected layout data meets manufacturing rules. Specifically, it is checked that according to the corrected layout data, the wiring patterns are open or short-circuited and meet design rules (processing dimension).

If the operation analysis part 46 determines that the signal performs the intended operation, the mask data creation part 51 creates mask data. The mask data creation part 51 creates mask data by inserting dummy rules which are given as dummy rule data stored in the dummy rule database 50, in data about wiring patterns stored in the layout database 47.

Next, an example of a process performed by the CAD system 40 shown in FIG. 8 will be described using a flow chart.

Figure 9:
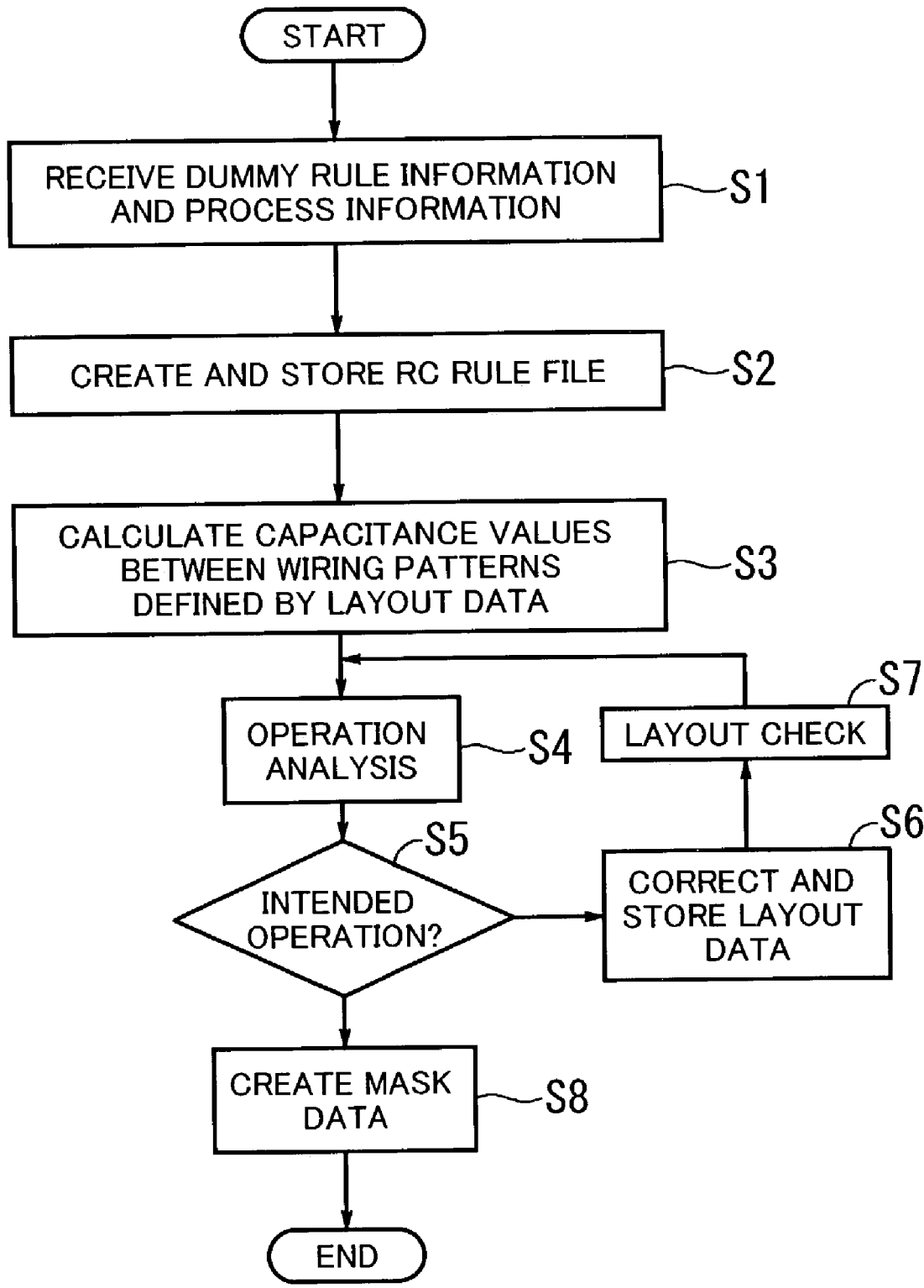
FIG. 9 is a flow chart of an example of a CAD process.
Figure 10:
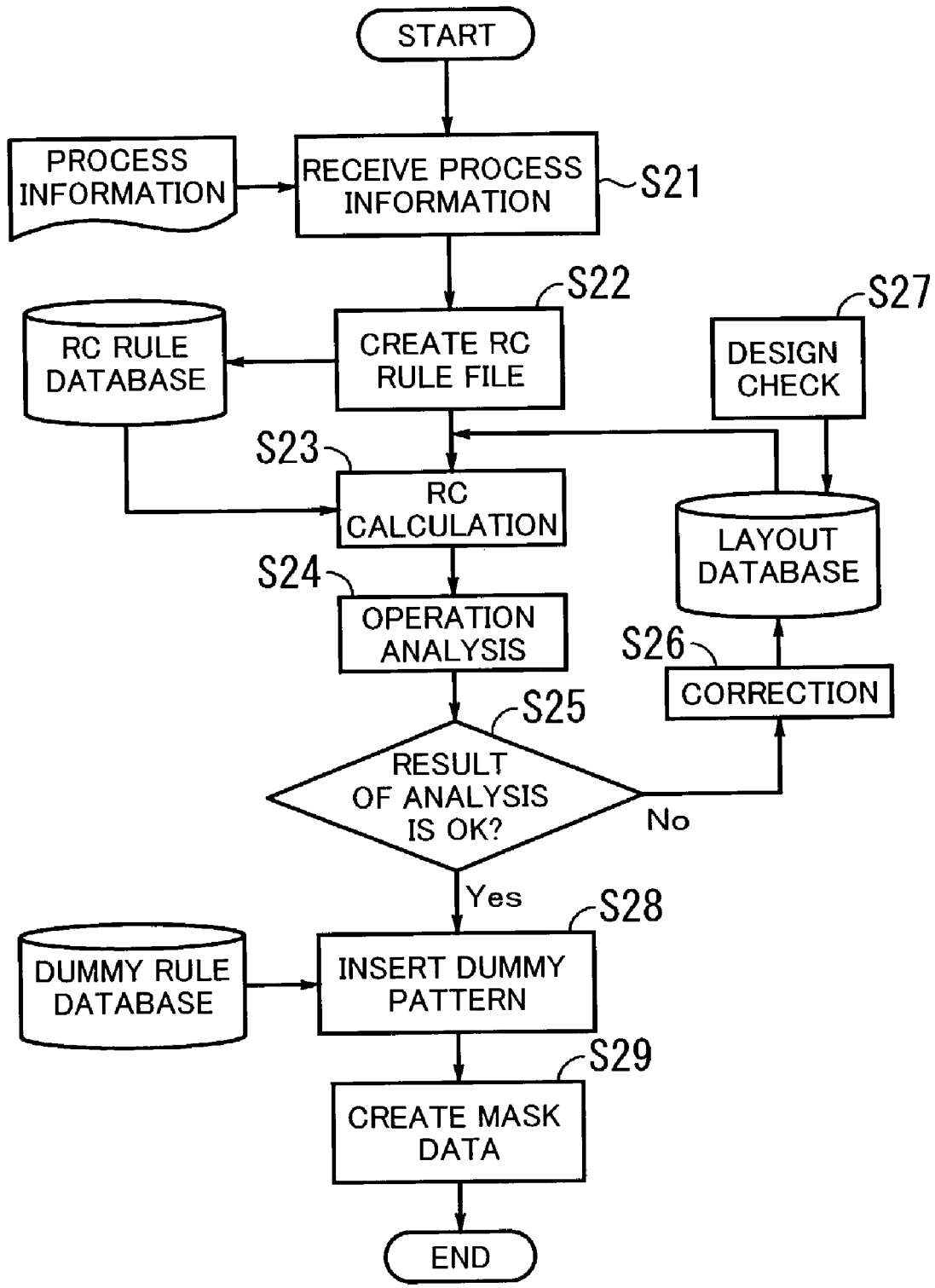
FIG. 10 shows a flow of a process performed by a conventional design tool.

FIG. 9 is a flow chart of an example of a CAD process. The CAD system 40 designs a semiconductor device taking the following steps:

[Step S1] The dummy information reception part 41 and the process information reception part 42 of the CAD system 40 receive dummy rule information 41a and process information 42a.

[Step S2] The RC rule file creation part 43 of the CAD system 40 calculates a capacitance value for each of wiring distances between the wiring patterns defined by the process information 42a, under the condition that a dummy pattern defined by the dummy rule information 41a is inserted between the wiring patterns. The RC rule file creation part 43 creates an RC rule file containing the calculated capacitance value for each of the wiring distances and stores it in the RC rule database 44.

[Step S3] The RC calculation part 45 of the CAD system 40 calculates capacitance values between wiring patterns defined by layout data stored in the layout database 47, referring to the RC rule file stored in the RC rule database 44.

[Step S4] The operation analysis part 46 of the CAD system 40 performs analysis of operation of a signal in the wiring patterns defined by layout data stored in the layout database 47, using the capacitance values calculated by the RC calculation part 45.

[Step S5] The operation analysis part 46 of the CAD system 40 determines whether or not the signal performs intended operation in the wiring patterns defined by layout data stored in the layout database 47. If the signal does not perform the intended operation, the CAD system 40 goes to step S6. If the signal performs the intended operation, the CAD system 40 goes to step S8.

[Step S6] The correction part 48 of the CAD system 40 corrects layout data about the wiring patterns stored in the layout database 47 so that the signal will perform the intended operation. The correction part 48 stores the corrected layout data about the wiring patterns in the layout database 47.

[Step S7] The design check part 49 of the CAD system 40 checks that the corrected layout data meets manufacturing rules.

[Step S8] The mask data creation part 51 of the CAD system 40 creates mask data by inserting dummy rules stored in the dummy rule database 50, in data about wiring patterns stored in the layout database 47.

As stated above, the RC rule file which contains a capacitance value for each of wiring distances between wiring patterns with a dummy pattern inserted is created, and then, referring to this RC rule file, capacitance values between the intended wiring patterns defined by layout data stored in the layout database 47 are calculated. Then, using the capacitance values calculated this way, analysis of operation of the wiring patterns defined by the layout data is performed. Hence, the operation analysis can be performed under the conditions which reflect a real device (with dummy patterns inserted).

Further, by receiving various dummy rule information, change in capacitance value between wiring patterns due to insertion of dummy patterns of different wiring structures can be calculated.

A capacitance value for each of wiring distances between the wiring patterns defined by process information is calculated. Then, a capacitance value for each of the wiring distances between the wiring patterns with a dummy pattern inserted is calculated by subtracting the wiring width of the dummy pattern from each of the wiring distances. Hence, the RC rule file can be created in a short time without performing complicated calculation.

The above process can be performed by a computer. In that case, a program containing instructions about what functions the CAD system 40 should perform is provided. When the program is executed by a computer, the above-described process is fulfilled on the computer. The program containing the instructions can be recorded on a recording medium readable by a computer. As the recording medium readable by a computer, magnetic storage devices, optical discs, magnetooptical recording media, semiconductor memories and the like are usable. Hard disc devices (HDD), flexible discs (FD), and magnetic tapes are examples of the magnetic storage device, DVD (Digital Versatile Disc), DVD-RAM (Random Access Memory), CD-ROM (Compact Disc Read Only Memory), CD-R (Recordable)/RW (ReWritable) are examples of the optical disc, and MO (Magneto-Optical disc) is an example of the magnetooptical recording medium.

In order to distribute the program, for example, a portable recording medium such as DVD and CD-ROM with the program recorded on is marketed. Alternatively, it can be arranged that the program stored in a storage device of a server computer is supplied from the server computer to other computers through a network.

For example, a computer which executes the program stores the program which is recorded on a portable recording medium or supplied from a server computer, in its own storage device. Then, the computer reads the program from its own storage device and performs operations according to the program. It is also possible that a computer reads the program directly from a portable recording medium and performs operations according to the program. Further, it is also possible to arrange that each time instructions of a program are supplied from a server computer to a computer, the computer performs operations according to the received instructions.

As stated above, in the present invention, dummy rule information about rules for dummy patterns and process information about wiring structure of wiring patterns are received, and a capacitance value for each of wiring distances between the wiring patterns defined by the process information is calculated, under the condition that a dummy pattern defined by the dummy rule information is inserted between the wiring patterns. Then, referring to the calculated capacitance value for each of the wiring distances, capacitance values between wiring patterns of an intended semiconductor device are calculated. Thus, a semiconductor device considering change in capacitance between wiring patterns due to an inserted dummy pattern can be designed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor-device design method using a computer, considering change in capacitance due to a dummy pattern, comprising the steps of:
   (a) receiving dummy rule information about rules for dummy patterns and process information about wiring structure of wiring patterns,
   (b) calculating a capacitance value for each of wiring distances between the wiring patterns defined by the process information, under the condition that a dummy pattern defined by the dummy rule information is inserted between the wiring patterns, and (c) calculating capacitance values between wiring patterns of an intended semiconductor device defined by data stored in a storage device, referring to the calculated capacitance value for each of the wiring distances.

2. The semiconductor-device design method according to claim 1, wherein the step (b) calculates the capacitance value for each of the wiring distances between the wiring patterns with the dummy pattern inserted between, by subtracting the wiring width or wiring height of the dummy pattern included in the dummy rule information from each of the wiring distances.

3. The semiconductor-device design method according to claim 1, further comprising the step (d) of performing analysis of signal propagation in the wiring patterns of the semiconductor device, using the calculated capacitance values between the wiring patterns of the semiconductor device.

4. The semiconductor-device design method according to claim 3, further comprising the step (e) of correcting the wiring patterns of the semiconductor device so that the signal propagation will meet intended conditions, if the step (d) shows that the signal propagation does not meet the intended conditions.

5. The semiconductor-device design method according to claim 4, wherein if the step (d) shows that the signal propagation time is less than an intended design value, the step (e) adjusts wiring distances between the wiring patterns of the semiconductor device, on the basis of the calculated capacitance value for each of the wiring distances, so that the signal propagation time will meet the intended design value.

6. The semiconductor-device design method according to claim 4, wherein the step (e) widens a wiring distance between wiring patterns of the semiconductor device so that a capacitance value between the wiring patterns will be equal to the capacitance value between the wiring patterns with no dummy pattern inserted.

7. The semiconductor-device design method according to claim 1, further comprising the step (f) of creating a rule file containing the calculated capacitance value for each of the wiring distances.

8. The semiconductor-device design method according to claim 7, wherein the step (f) creates the rule file to contain a capacitance value for each of wiring distances between the wiring patterns measured in a wiring width direction and/or a capacitance value for each of wiring distances between the wiring patterns measured in a wiring height direction.

9. The semiconductor-device design method according to claim 7, wherein the step (c) calculates the capacitance values between the wiring patterns of the semiconductor device, referring to the rule file.

10. The semiconductor-device design method according to claim 1, further comprising the step (g) of generating mask data by inserting data about the dummy pattern in data about the wiring patterns of the semiconductor device.

11. A semiconductor-device design program considering change in capacitance due to a dummy pattern, the program making a computer receive dummy rule information about rules for dummy patterns and process information about wiring structure of wiring patterns, calculate a capacitance value for each of wiring distances between the wiring patterns defined by the process information, under the condition that a dummy pattern defined by the dummy rule information is inserted between the wiring patterns, and calculate capacitance values between wiring patterns of an intended semiconductor device defined by data stored in a storage device, referring to the calculated capacitance value for each of the wiring distances.

12. A recording medium readable by a computer on which a semiconductor-device design program considering change in capacitance due to a dummy pattern is recorded, the program making a computer receive dummy rule information about rules for dummy patterns and process information about wiring structure of wiring patterns, calculate a capacitance value for each of wiring distances between the wiring patterns defined by the process information, under the condition that a dummy pattern defined by the dummy rule information is inserted between the wiring patterns, and calculate capacitance values between wiring patterns of an intended semiconductor device defined by data stored in a storage device, referring to the calculated capacitance value for each of the wiring distances.

13. A semiconductor-device design apparatus considering change in capacitance due to a dummy pattern, comprising:

an information reception part for receiving dummy rule information about rules for dummy patterns and process information about wiring structure of wiring patterns, a capacitance calculation part for calculating a capacitance value for each of wiring distances between the wiring patterns defined by the process information, under the condition that a dummy pattern defined by the dummy rule information is inserted between the wiring patterns, and a wiring-pattern capacitance calculation part for calculating capacitance values between wiring patterns of an intended semiconductor device defined by data stored in a storage device, referring to the calculated capacitance value for each of the wiring distances.

* * * * *